(12) United States Patent
Kim et al.

(10) Patent No.: US 7,851,311 B2
(45) Date of Patent: Dec. 14, 2010

(54) METHOD OF MANUFACTURING NON-VOLATILE MEMORY DEVICE

(75) Inventors: Nam-Kyeong Kim, Icheon-Si (KR); Jae Chul Om, Kyeongki-do (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 12/497,280

(22) Filed: Jul. 2, 2009

(65) Prior Publication Data

US 2009/0269895 A1    Oct. 29, 2009

Related U.S. Application Data

(62) Division of application No. 11/634,570, filed on Dec. 6, 2006, now Pat. No. 7,573,089.

(30) Foreign Application Priority Data

May 15, 2006    (KR) ............... 2006-43325

(51) Int. Cl.
 *H01L 21/336* (2006.01)
(52) U.S. Cl. .............. 438/270; 438/201; 438/257; 438/259; 438/589; 257/315; 257/330; 257/E21.419
(58) Field of Classification Search .......... 438/201, 438/257, 259, 270, 589; 257/315, 330, E21.419
See application file for complete search history.

(56) References Cited

U.S. PATENT DOCUMENTS

| | | | |
|---|---|---|---|
| 5,796,141 A | 8/1998 | Lin et al. | |
| 6,720,611 B2 | 4/2004 | Jang | |
| 6,743,695 B2 | 6/2004 | Lee et al. | |
| 6,969,686 B2 | 11/2005 | Hsieh et al. | |
| 2004/0245562 A1 | 12/2004 | Hsiao et al. | |
| 2006/0043457 A1 | 3/2006 | Baik | |
| 2006/0127680 A1 | 6/2006 | Tzou et al. | |
| 2006/0216894 A1 | 9/2006 | Parekh et al. | |
| 2007/0077704 A1 | 4/2007 | Nieh | |

FOREIGN PATENT DOCUMENTS

| | | |
|---|---|---|
| KR | 10-1998-0039618 | 8/1998 |
| KR | 10-1999-0063156 | 7/1999 |
| KR | 10-2001-0020984 | 3/2001 |

*Primary Examiner*—Andy Huynh
(74) *Attorney, Agent, or Firm*—Marshall, Gerstein & Borun LLP

(57) ABSTRACT

Non-volatile memory devices and a method of manufacturing the same, wherein data storage of two bits per cell is enabled and the devices can pass the limit in terms of layout, whereby channel length can be controlled. The non-volatile memory device includes gate lines formed in one direction on a semiconductor substrate in which trenches are formed, wherein the gate lines gap-fill the trenches, a dielectric layer formed between the semiconductor substrate and the gate lines, bit separation insulating layers formed between the semiconductor substrate and the dielectric layer under the trenches, and isolation structures formed by etching the trenches, and the dielectric layer and the semiconductor substrate between the trenches in a line form vertical to the gate lines and gap-filling an insulating layer.

11 Claims, 5 Drawing Sheets

METHOD OF MANUFACTURING NON-VOLATILE MEMORY DEVICE

CROSS-REFERENCE TO RELATED APPLICATIONS

This is a division of U.S. application Ser. No. 11/634,570 filed Dec. 6, 2006, which claims the priority benefit under USC 119 of KR 2006-43325 filed May 15, 2006, the entire respective disclosures of which are incorporated herein by reference.

BACKGROUND OF THE INVENTION

The invention relates, in general, to non-volatile memory devices and, more particularly, to non-volatile memory devices and a method of manufacturing the same, wherein data storage of two bits per cell is enabled and wherein the devices can pass the limit in terms of the layout, whereby a channel length can be controlled.

Flash memory is a type of non-volatile memory that retains information stored therein even if power is off, and is largely classified into a NOR type and a NAND type.

NOR flash memory requires one contact per two cells. NOR flash memory is disadvantageous in a high level of integration, but is advantageous in high speed operation since the cell current is high. NAND flash memory is disadvantageous in high speed operation since the cell current is low, but is advantageous in a high level of integration since a number of cells share one contact. Accordingly, NAND flash memory has recently been used in digital still cameras, and so on and therefore has been in the spotlight as the next-generation memory.

Generally a flash memory cell has a structure in which a tunnel oxide layer, a floating gate, a gate dielectric layer, and a control gate are sequentially laminated on a semiconductor substrate. The program and erase operations are performed by injecting electrons into or extracting them from the floating gate. The flash memory cell is also called "floating gate memory."

The floating gate memory is severely restricted in scale down because of a voltage-divided coupling method and an Inter-Poly Oxide (IPO) structure.

In recent years, Silicon Oxide Nitride Oxide Silicon (SONOS) type non-volatile memory, which has solved the scale-down restriction of the floating gate memory, has been in the spotlight.

The SONOS type non-volatile memory employs a difference in the electrical potential between the oxide layer and the nitride layer. This corresponds to the principle that electrons trapped at the nitride layer retain their non-volatile characteristic by the potential barrier of an underlying oxide layer without being lost, although power is off. A program operation is performed by applying a voltage through which electrons can tunnel a thin oxide layer under the nitride layer. A read operation is performed by allowing a differential amplifier to determine a difference in the driving current, which is incurred by a difference in the threshold voltage of the transistor depending on program.

In the SONOS type non-volatile memory, elements can operate without voltage dividing since there is no IPO unlike the floating gate memory. The SONOS type non-volatile memory is very simple in structure. However, it is expected that the SONOS type non-volatile memory will reach the limit of integration. Accordingly, there is a need for a technique capable of increasing the level of integration per unit pitch as well as scale-down.

SUMMARY OF THE INVENTION

Accordingly, the invention addresses the above problems, and provides a non-volatile memory device and a method of manufacturing the same, in which it enables data storage of two bits per cell and can pass the limit in terms of the layout, whereby a channel length can be controlled.

A non-volatile memory device according to an aspect of the invention includes gate lines formed in one direction on a semiconductor substrate in which trenches are formed, wherein the gate lines gap-fill the trenches, a dielectric layer formed between the semiconductor substrate and the gate lines, bit separation insulating layers formed between the semiconductor substrate and the dielectric layer under the trenches, and isolation layers formed by etching the trenches, and the dielectric layer and the semiconductor substrate between the trenches in a line form vertical to the gate lines and gap-filling an insulating layer.

A method of manufacturing a non-volatile memory device according to another aspect of the invention includes the steps of forming trenches in a semiconductor substrate and forming bit separation insulating layers under the trenches, forming a dielectric layer and a first conductive layer within each of the trenches in which bit separation insulating layers are respectively formed, etching the trenches, and the semiconductor substrate between the trenches and gap-filling an insulating layer to form isolation structures, forming a second conductive layer on the dielectric layer and the first conductive layer, and etching the second conductive layer, the dielectric layer, the first conductive layer, the bit separation insulating layers and the semiconductor substrate to form gate lines arranged in one direction.

DETAILED DESCRIPTION OF EMBODIMENTS

Specific embodiments according to the invention are described below with reference to the accompanying drawings.

Figure 1:
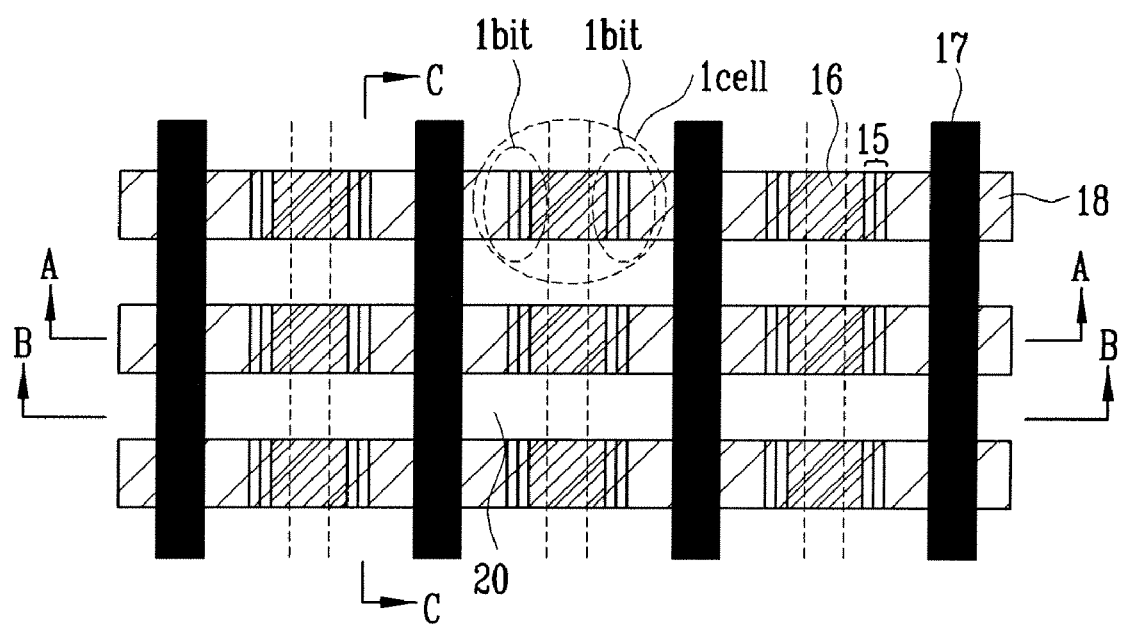
FIG. 1 is a plan view illustrating a non-volatile memory device according to the invention.
Figure 2:
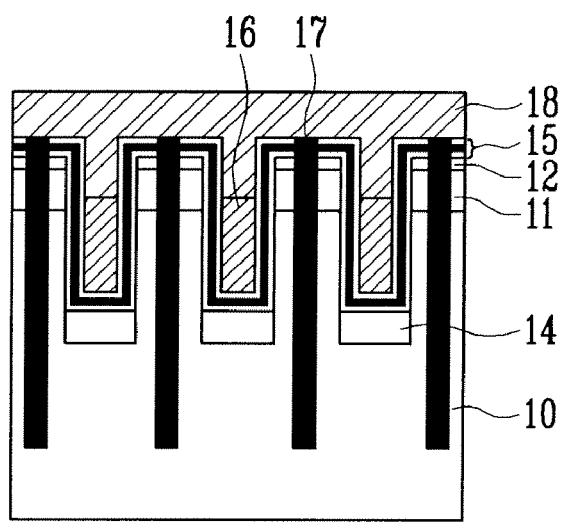
FIG. 2 is a cross-sectional view of the non-volatile memory device taken along line A-A in FIG. 1.
Figure 3:
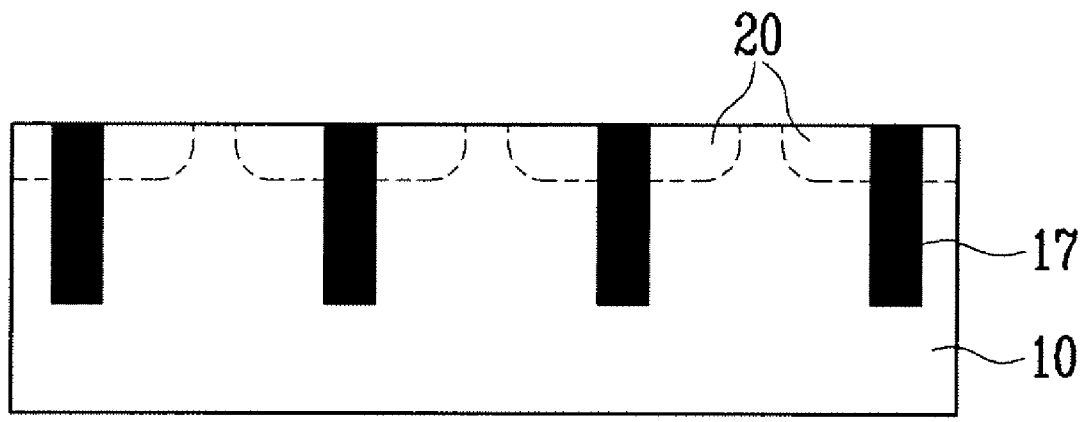
FIG. 3 is a cross-sectional view of the non-volatile memory device taken along line B-B in FIG. 1.
Figure 4:
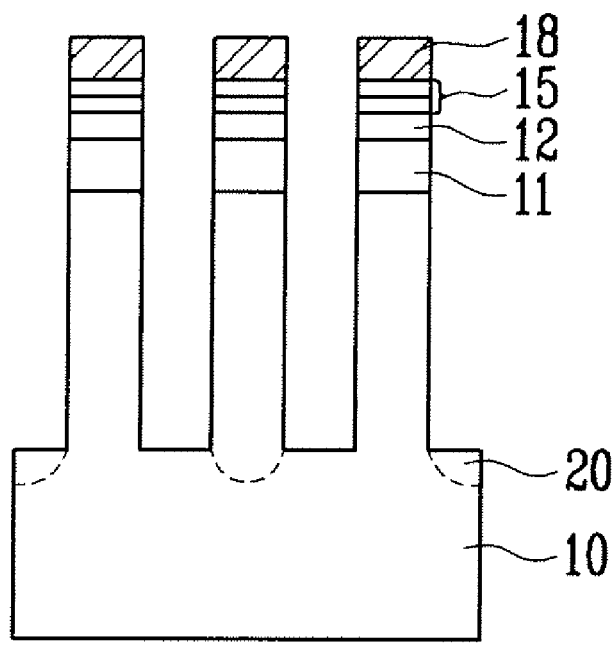
FIG. 4 is a cross-sectional view of the non-volatile memory device taken along line C-C in FIG. 1.

FIG. 1 is a plan view illustrating a non-volatile memory device according to the invention. FIG. 2 is a cross-sectional view of the non-volatile memory device taken along line A-A in FIG. 1. FIG. 3 is a cross-sectional view of the non-volatile memory device taken along line B-B in FIG. 1. FIG. 4 is a cross-sectional view of the non-volatile memory device taken along line C-C in FIG. 1.

Referring to FIGS. 1 to 4, gate lines 19 are arranged on a semiconductor substrate 10 in one direction. Trenches are formed in the semiconductor substrate 10 under the gate lines 19 in a vertical direction to the gate lines 19. A dielectric layer 15 is formed below the gate lines 19 along a surface profile of the semiconductor substrate 10 in which the trenches 13 are formed.

The dielectric layer 15 has a structure in which a tunnel oxide layer, a trap nitride layer on which charges will be accumulated, and a stopper oxide layer are laminated. The tunnel oxide layer and the stopper oxide layer may be formed using $SiO_2$, and the trap nitride layer may be formed using $Si_3N_4$. It is preferred that each of the tunnel oxide layer, the trap nitride layer and the stopper oxide layer be formed to a thickness of 1 Å to 1000 Å.

Each of the gate lines 19 includes a first conductive layer 16 buried in each trench 13, and a second conductive layer 18 electrically connected to the first conductive layer 16 and formed on the dielectric layer 15. It is preferred that the first conductive layer 16 be formed of polysilicon and the second conductive layer 18 be formed of tungsten silicide ($WSi_x$).

Bit separation insulating layers 14 are formed between the semiconductor substrate 10 and the dielectric layer 15 under the trenches 13. A lamination layer of a first insulating layer 11 made of an oxide layer, and a hard mask layer 12 are formed between the semiconductor substrate 10 and the dielectric layer 15 in which the trenches 13 are formed under the gate lines 19.

Furthermore, isolation layers 17 are formed between the trenches 13 in line form. The isolation layers 17 are formed by etching the dielectric layer 15 and the semiconductor substrate 10 in a vertical direction to the arrangement direction of the gate lines 19 and gap-filling the insulating layers. The isolation layers 17 define active regions.

Meanwhile, the semiconductor substrate 10 is exposed at both sides of the gate lines 19. The semiconductor substrate 10 is located below the bottom surface of the trench 13 and has the active regions defined by the isolation layers 17. A source or drain 20 is formed in the active region of the exposed semiconductor substrate 10. The source and drain 20 are separated with a region of a line fashion parallel to the intervening isolation layers 17.

A method of manufacturing the non-volatile memory device constructed above is described below.

FIGS. 5A to 5F are cross-sectional views illustrating a method of manufacturing the non-volatile memory device according to the embodiment of the invention. FIG. 6 illustrates a mask used in an ion implant process for forming the source and drain.

Figure 5A:
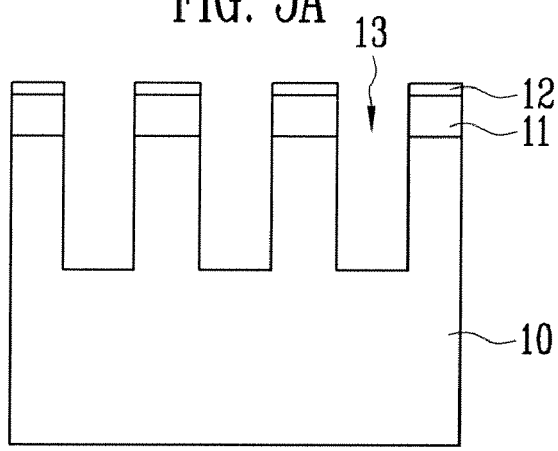
FIGS. 5a to 5f are cross-sectional views illustrating a method of manufacturing the non-volatile memory device according to the embodiment of the invention.
Figure 6:
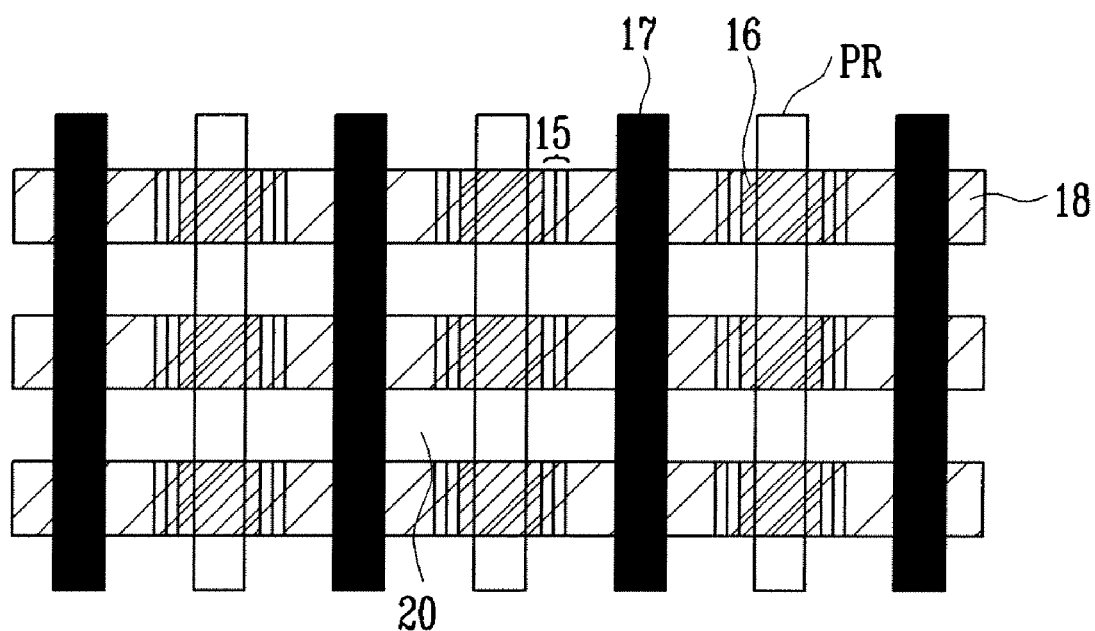
FIG. 6 illustrates a mask used in an ion implant process for forming the source and drain.

Referring to FIG. 5A, the first insulating layer 11 and the hard mask layer 12 are sequentially formed on the semiconductor substrate 10. The hard mask layer 12, the first insulating layer 11, and the semiconductor substrate 10 are etched to a thickness by photo and etch processes, forming a plurality of the trenches 13 arranged in one direction. The first insulating layer 11 is preferably formed of an oxide layer.

Figure 5B:
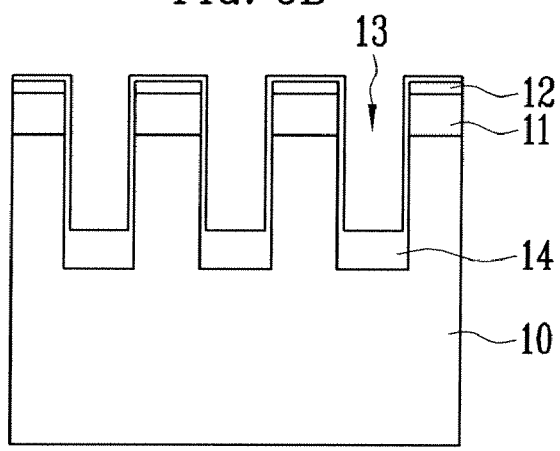

Referring to FIG. 5B, the bit separation insulating layers 14 are formed on the entire surface including the trenches 13 by employing an oxide layer.

Figure 5C:
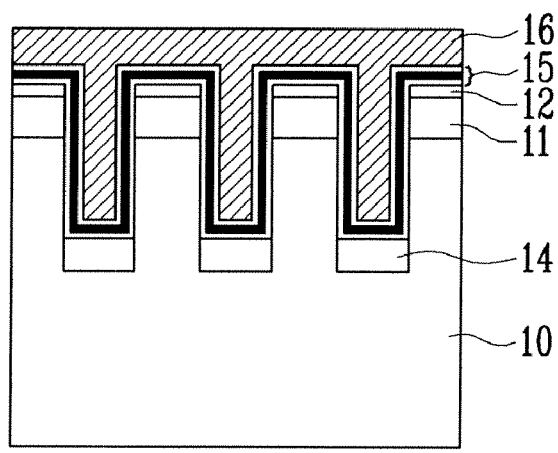

Referring to FIG. 5C, the bit separation insulating layers 14 formed on the sides of the trenches 13 and outside the trenches 13 are stripped by an etch-back process, so that the bit separation insulating layers 14 having a constant thickness remain under the trenches 13. The remaining bit separation insulating layers 14 serve to enable data storage of two bits per cell. The etch-back process may employ a dry etch process or a wet etch process. In the case where the wet etch process is used, wet chemical, such as HF, Buffer Oxide Etchant (BOE), $NH_4$ or $H_3PO_4$, may be used.

The dielectric layer 15 including a lamination layer of the tunnel oxide layer, the trap nitride layer on which charges will be accumulated, and the stopper oxide layer is formed on the entire surface including the trenches 13. The first conductive layer 16 is formed on the dielectric layer 15, thereby gap-filling the trenches 13.

It is preferred that the tunnel oxide layer and the stopper oxide layer of the dielectric layer 15 be formed of $SiO_2$ and the trap nitride layer be formed of $Si_3N_4$. It is also preferred that the first conductive layer 16 be formed of polysilicon. Each of the tunnel oxide layer, the trap nitride layer and the stopper oxide layer is preferably formed to a thickness of 1 Å to 1000 Å.

Figure 5D:
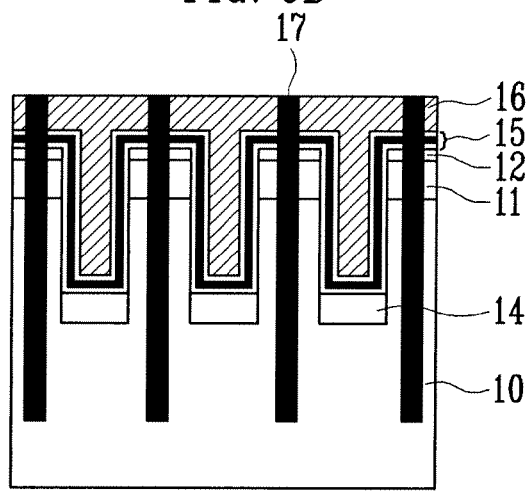

Referring to FIG. 5D, the first conductive layer 16, the dielectric layer 15, the hard mask layer 12, the first insulating layer 11 and the semiconductor substrate 10 between the trenches 13 are etched to form isolation trenches parallel to the trenches 13. An insulating layer is gap-filled in the isolation trenches and is polished to form the isolation structures 17. The isolation trenches are formed deeper than the trenches 13.

Figure 5E:
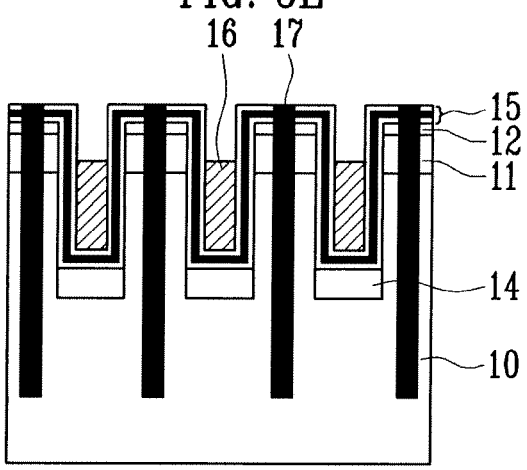

Referring to FIG. 5E, the first conductive layer 16 is recessed to expose top surfaces of the trenches 13.

Figure 5F:
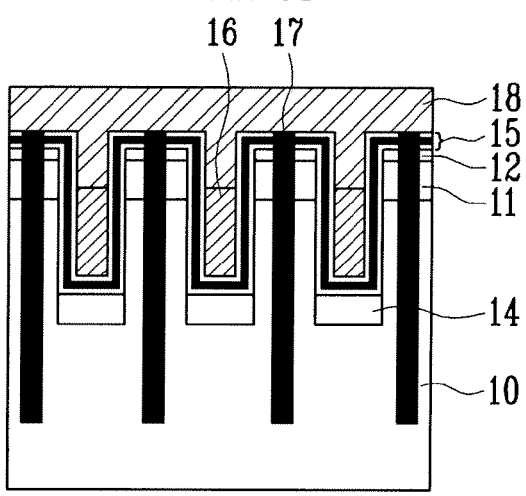

Referring to FIG. 5F, the second conductive layer 18 is formed on the entire surface. The second conductive layer 18 is preferably formed of tungsten silicide.

The lamination structures from the second conductive layer 18 to the bit separation insulating layers 14 are selectively etched to form the gate lines arranged vertically to the arrangement direction of the isolation layer 17.

Referring to FIG. 6, the active regions defined by the isolation layer 17 and photoresists (PR) parallel to the isolation structures 17 are formed. An impurity ion is implanted using the photoresists PR as a mask. An impurity ion implanted by an annealing process is diffused to form the source or drain 20. At the time of the annealing process, Rapid Thermal Process (RTP) equipment or a furnace may be used. In the case where the RTP equipment is used, the annealing process is preferably performed under a reduction atmosphere, an annealing temperature is set to 700° C. to 1500° C., and a step-up rate is set to 30° C. to 75° C. per minute. Meanwhile, in the case where the furnace is used, an annealing temperature is set to 800° C. to 1500° C.

The fabrication of the non-volatile memory device according to the invention is thereby completed.

A program operation of the non-volatile memory device according to the invention is performed in such a manner that charges of the semiconductor substrate 10 tunnel the tunnel oxide layer of the dielectric layer 15 formed on both sides of the trench 13 and are then trapped at the trap nitride layer. At this time, since a thickness of the bit separation insulating layer 14 is thick, the charges of the semiconductor substrate 10 do not tunnel the bit separation insulating layers 14 and the tunnel oxide layer under the trenches 13. Accordingly, the charges are not trapped at the trap nitride layer formed under the trenches 13. Therefore, the trap nitride layers on both sides of the trench 13 at which the charges are trapped are electrically separated by the trap nitride layers under the trenches 13, enabling data storage of 2 bits per cell.

Meanwhile, a channel is formed on a lateral surface of the trench 13. A channel length can be controlled by controlling the depth of the trench 13.

As described above, according to the invention, since data storage of two bits per cell is possible, the level of integration of devices can be improved. Furthermore, since the channel is formed on the lateral surface of the trench, the channel length can be controlled by passing the layout limit.

Although the foregoing description has been made with reference to various embodiments, changes and modifications may be made by those of ordinary skill in the art without departing from the spirit and scope of the invention.

What is claimed is:

1. A method of manufacturing a non-volatile memory device, comprising the steps of:

forming trenches in a semiconductor substrate and forming bit separation insulating layers at a bottom of the trenches;

forming a dielectric layer on an entire structure including a sidewall of the trench, wherein the dielectric layer comprises a tunnel oxide layer, a trap nitride layer and a stopper oxide layer;

forming a first conductive layer within each of the trenches in which the dielectric layer is formed;

etching the semiconductor substrate between the trenches and gap-filling an insulating layer to form isolation layers;

forming a second conductive layer on the dielectric layer and the first conductive layer; and etching the second conductive layer, the dielectric layer, the first conductive layer, the bit separation insulating layers and the semiconductor substrate to form gate lines arranged in one direction.

2. The method of claim 1, further comprising the step of partially recessing the first conductive layer after the isolation layers are formed.

3. The method of claim 1, comprising, before the trenches are formed, forming an insulating layer and a hard mask layer on the semiconductor substrate.

4. The method of claim 2, wherein the insulating layer comprises an oxide layer.

5. The method of claim 1, further comprising the steps of:

after forming the gate lines, forming photoresists on an entire surface, wherein the photoresists cross the semiconductor substrate between the isolation layers in parallel to the isolation layers; and implanting an impurity ion using the photoresists as a mask, forming sources and drains.

6. The method of claim 1, wherein the first conductive layer comprises polysilicon.

7. The method of claim 1, wherein the second conductive layer comprises WSix.

8. The method of claim 1, wherein the dielectric layer has a thickness of 1 Å to 100 Å.

9. The method of claim 1, comprising forming the isolation layers are formed deeper than the trenches.

10. The method of claim 1, wherein the step of forming the bit separation insulating layers comprises the steps of:

forming an insulating layer on an entire surface of the trenches; and stripping the insulating layers formed on both sides of the trenches.

11. The method of claim 1, comprising stripping the bit separation insulating layers formed on both sides by a wet etch process or a dry etch process.

* * * * *